(12) United States Patent
Sturcken et al.

(10) Patent No.: US 10,002,828 B2
(45) Date of Patent: Jun. 19, 2018

(54) METHODS FOR MICROELECTRONICS FABRICATION AND PACKAGING USING A MAGNETIC POLYMER

(71) Applicant: Ferric Inc., New York, NY (US)

(72) Inventors: Noah Sturcken, New York, NY (US); Ryan Davies, New York, NY (US)

(73) Assignee: Ferric, Inc., New York, NY (US)

( * ) Notice: Subject to any disclaimer, the term of this patent is extended or adjusted under 35 U.S.C. 154(b) by 0 days. days.

(21) Appl. No.: 15/409,697

(22) Filed: Jan. 19, 2017

(65) Prior Publication Data

US 2017/0250134 A1  Aug. 31, 2017

Related U.S. Application Data

(62) Division of application No. 15/053,747, filed on Feb. 25, 2016.

(51) Int. Cl.
*H01L 23/522* (2006.01)
*H01L 49/02* (2006.01)
(Continued)

(52) U.S. Cl.
CPC ............ *H01L 23/5227* (2013.01); *C08K 3/08* (2013.01); *C08K 3/22* (2013.01); *H01F 41/0206* (2013.01); *H01F 41/04* (2013.01); *H01L 21/321* (2013.01); *H01L 21/563* (2013.01); *H01L 23/295* (2013.01); *H01L 23/3142* (2013.01); *H01L 23/528* (2013.01); *H01L 23/5226* (2013.01); *H01L 24/17* (2013.01); *H01L 24/81* (2013.01); *H01L 24/83* (2013.01); *H01L 24/92* (2013.01); *H01L 28/10* (2013.01);
(Continued)

(58) Field of Classification Search
None
See application file for complete search history.

(56) References Cited

U.S. PATENT DOCUMENTS 1,553,983 A   9/1925 Casper
2,931,966 A   4/1960 Rocket
(Continued)

FOREIGN PATENT DOCUMENTS

FR    2817622 A1   6/2002
JP    05082736 A   4/1993
(Continued)

OTHER PUBLICATIONS

N. Sturcken et al., "Design of Coupled Power Inductors with Crossed Anisotropy Magnetic Core for Integrated Power Conversion".
(Continued)

*Primary Examiner* — Reema Patel
*Assistant Examiner* — Steven Christopher
(74) *Attorney, Agent, or Firm* — Intrinsic Law Corp.

(57) ABSTRACT

A magnetic polymer for use in microelectronic fabrication includes a polymer matrix and a plurality of ferromagnetic particles disposed in the polymer matrix. The magnetic polymer can be part of an insulation layer in an inductor formed in one or more backend wiring layers of an integrated device. The magnetic polymer can also be in the form of a magnetic epoxy layer for mounting contacts of the integrated device to a package substrate.

12 Claims, 10 Drawing Sheets

(51) Int. Cl.
  *H01L 23/528*    (2006.01)
  *H01L 23/29*     (2006.01)
  *H01L 23/31*     (2006.01)
  *H01L 21/56*     (2006.01)
  *H01L 23/00*     (2006.01)
  *C08K 3/22*      (2006.01)
  *C08K 3/08*      (2006.01)
  *H01F 41/02*     (2006.01)
  *H01F 41/04*     (2006.01)
  *H01L 21/321*    (2006.01)

(52) U.S. Cl.
  CPC ............ *C08K 2003/0843* (2013.01); *C08K 2003/0856* (2013.01); *C08K 2003/0862* (2013.01); *C08K 2003/2265* (2013.01); *C08K 2003/2289* (2013.01); *C08K 2003/2293* (2013.01); *H01L 2224/13022* (2013.01); *H01L 2224/13147* (2013.01); *H01L 2224/16225* (2013.01); *H01L 2224/16265* (2013.01); *H01L 2224/2929* (2013.01); *H01L 2224/2936* (2013.01); *H01L 2224/29355* (2013.01); *H01L 2224/29357* (2013.01); *H01L 2224/32225* (2013.01); *H01L 2224/73204* (2013.01); *H01L 2224/831* (2013.01); *H01L 2224/8312* (2013.01); *H01L 2224/83855* (2013.01); *H01L 2224/83909* (2013.01); *H01L 2224/92125* (2013.01); *H01L 2924/0665* (2013.01); *H01L 2924/13067* (2013.01); *H01L 2924/13091* (2013.01); *H01L 2924/14* (2013.01); *H01L 2924/1425* (2013.01); *H01L 2924/19011* (2013.01); *H01L 2924/19041* (2013.01); *H01L 2924/19042* (2013.01); *H01L 2924/19043* (2013.01); *H01L 2924/19102* (2013.01); *H01L 2924/2064* (2013.01); *H01L 2924/2075* (2013.01); *H01L 2924/3025* (2013.01)

(56) References Cited

U.S. PATENT DOCUMENTS

| | | |
|---|---|---|
| 3,614,554 A | 10/1971 | Shield et al. |
| 5,070,317 A | 12/1991 | Bhagat |
| 5,225,971 A | 7/1993 | Spreen |
| 5,319,343 A | 6/1994 | Jeffries |
| 5,583,474 A | 12/1996 | Mizoguchi |
| 5,635,892 A | 6/1997 | Ashby |
| 5,831,431 A | 11/1998 | Gottfried-Gottfried et al. |
| 6,362,986 B1 | 3/2002 | Schultz |
| 6,542,060 B2 | 4/2003 | Fedeli |
| 6,542,379 B1 | 4/2003 | Lauffer |
| 6,856,226 B2 | 2/2005 | Gardner |
| 6,940,384 B2 | 9/2005 | Hooey et al. |
| 7,636,242 B2 | 12/2009 | Hazucha |
| 7,719,084 B2 | 5/2010 | Gardner |
| 7,867,787 B2 | 1/2011 | Gardner |
| 8,108,984 B2 | 2/2012 | Gardner |
| 8,558,344 B2 * | 10/2013 | Chen ............... H01L 28/10 257/528 |
| 2002/0060621 A1 | 5/2002 | Duffy et al. |
| 2003/0070282 A1 | 4/2003 | Hiatt et al. |
| 2004/0135661 A1 | 7/2004 | Haugs et al. |
| 2005/0088269 A1 | 4/2005 | Hatano et al. |
| 2007/0290362 A1 | 12/2007 | Hsu et al. |
| 2009/0175014 A1 | 7/2009 | Zeng et al. |
| 2009/0188104 A1 | 7/2009 | Ching et al. |
| 2011/0279214 A1 | 11/2011 | Lee et al. |
| 2013/0056847 A1 | 3/2013 | Chen |
| 2014/0027879 A1 | 1/2014 | Weyers et al. |
| 2014/0240074 A1 | 8/2014 | Qui et al. |
| 2014/0252548 A1 | 9/2014 | Yen et al. |
| 2015/0243881 A1 * | 8/2015 | Sankman ............ H01L 23/295 361/679.55 |
| 2016/0233153 A1 * | 8/2016 | Kidwell, Jr. ........ H01L 23/5227 |
| 2017/0256353 A1 | 9/2017 | Park et al. |

FOREIGN PATENT DOCUMENTS

| | | |
|---|---|---|
| JP | 05291063 | 11/1993 |
| JP | H09162354 A | 6/1997 |

OTHER PUBLICATIONS

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering 10.8A/mm", IEEE International Solid-State Circuits Conference, Feb. 22, 2012, p. 3-5, Session 23, IEEE.

N. A. Sturcken, "Integrated Voltage Regulators with Thin-Film Magnetic Power Inductors", 2013, Columbia University.

* cited by examiner

METHODS FOR MICROELECTRONICS FABRICATION AND PACKAGING USING A MAGNETIC POLYMER

RELATED APPLICATIONS

This application is a divisional of U.S. patent application Ser. No. 15/053,747, entitled "Systems and Methods for Microelectronics Fabrication and Packaging Using a Magnetic Polymer," filed on Feb. 25, 2016, which is hereby incorporated by reference.

TECHNICAL FIELD

The present application is directed to fabrication and packaging of integrated multiple wiring layer devices having an inductor integrated into at least one wiring layer.

BACKGROUND

The increase in computing power and spatial densities in semiconductor based devices and energy efficiency of the same allow for ever more efficient and small microelectronic sensors, processors and other machines. These have found wide use in mobile and wireless applications and other industrial, military, medical and consumer products.

Even though computing energy efficiency is improving over time, the total amount of energy used by computers of all types is on the rise. Hence, there is a need for even greater energy efficiency. Most efforts to improve the energy efficiency of microelectronic devices has been at the chip and transistor level, including with respect to transistor gate width. However, these methods are limited and other approaches are necessary to increase device density, processing power and to reduce power consumption and heat generation at the same time.

One field that can benefit from the above improvements is switched inductor power conversion devices. Power supplies include power converters that convert one form of electrical energy to another. A regulated power supply is one that controls the output voltage or current to a specific value; the controlled value is held nearly constant despite variations in either load current or the voltage supplied by the power supply's energy source.

In microelectronics fabrication, polymer-based materials are used for photoresists, which are photoimageable (light-sensitive) materials used in photolithography. Photolithography is a process that is used to pattern films or substrates of microelectronic components for device fabrication. Photoresists such as polyimide can also provide electrical insulation in fabricated devices. Such photoresists are thermoset polymers that are deposited, patterned, and cured during fabrication. Once cured, these polymers also provide excellent mechanical and thermal stability and chemical resistance. Curing is a type of heat treatment that is dependent on the temperature, time and ambient environment. For fabrication of CMOS compatible thin-film inductors, photoresist polymers are cured to provide permanent electrical insulation between the inductor coils and the magnetic core layers. In addition, the cured photoresist polymers provide stress-relief due to the presence of large tensile or compressive stresses in adjacent metal and magnetic layers.

Underfill epoxies were developed to increase the reliability of solder bumps and allow for flip chip assembly, a lower cost assembly method for microelectronic components on substrates. These epoxies are polymer-based materials that provide electrical insulation and adhesion between microelectronic components. They mitigate the stresses associated with thermal mismatch between electronic packaging and silicon layers. They also alleviate stresses resulting from electrical, mechanical and thermal cycling typical in microelectronic operation. Underfill epoxies are typically thermoset polymers that are in a viscous state that changes irreversibly into an insoluble polymer network by curing. These epoxies are composites of a polymer resin and hardener that are selected based on the required viscosity, or "ability to flow," of the underfill between the components. The viscosity of the underfill epoxy is important because the epoxy needs to fill any voids between the microelectronic components to which the epoxy is providing adhesion before the it is cured. The curing process causes reactions to take place between the resin and hardener that results in cross-linking where the precursor materials rigidize into a network of permanently shaped molecules. A cured underfill epoxy provides excellent mechanical and thermal stability.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

In an aspect, the invention is directed to a method of fabricating a structure. The method includes disposing a plurality of ferromagnetic particles in an epoxy matrix to form a magnetic epoxy. The method also includes mounting a package substrate on a plurality of contacts of a semiconductor integrated circuit or an integrated passive device, wherein the contacts define a gap between the substrate and the semiconductor integrated circuit or the integrated passive device, the semiconductor integrated circuit or the integrated passive device comprising a multilevel wiring network and an inductor, the inductor integrated into at least one level of the multilevel wiring network. The method also includes flowing the magnetic epoxy into the gap, the magnetic epoxy substantially surrounding the contacts. The method also includes curing the magnetic epoxy to adhere the substrate to the semiconductor integrated circuit or the integrated passive device.

In one or more embodiments, the method also includes applying a magnetic field while flowing the magnetic epoxy, the magnetic field drawing the magnetic epoxy into the gap. In one or more embodiments, the method also includes applying a magnetic field while curing the magnetic epoxy, the magnetic field configured to align an easy axis of magnetization of the magnetic epoxy with an axis parallel to a height of the magnetic epoxy, thereby aligning a hard axis of magnetization of the magnetic epoxy with a plane parallel to the package substrate.

In one or more embodiments, the inductor is formed by depositing a magnetic material and depositing a photoresist on said magnetic material to form a laminate structure. In one or more embodiments, the photoresist comprises a magnetic polymer. In one or more embodiments, the inductor includes a core formed by (a) depositing a magnetic material to form a first layer and (b) depositing said magnetic material on said first layer in an oxygen-rich environment to form an insulating layer on said first layer of said magnetic material, said insulating layer comprising an oxide of said magnetic material. In one or more embodiments, the inductor includes a core formed by (a) depositing a magnetic material to form a first layer and (b) exposing said first layer to an oxygen-rich environment to form a thermal oxide on said first layer. In one or more embodiments, the inductor includes a core formed by (a) depositing a magnetic material to form a first layer and (b) depositing a magnetic polymer on said first layer.

In one or more embodiments, the method also includes forming said inductor from a planar magnetic core and a conductive winding, wherein said planar magnetic core has a principal plane; and orienting said principal plane in parallel with wiring planes of said multilevel wiring network. In one or more embodiments, the method also includes turning said conductive winding around in a generally spiral manner on the outside of said planar magnetic core; and constructing said conductive winding piecewise of wire segments and of vertical interconnect accesses (VIAs), wherein said wire segments pertain to at least two of said wiring planes and said VIAs are interconnecting said at least two wiring planes. In one or more embodiments, the method also includes disposing a magnetic polymer around said core, wherein the magnetic polymer forms an electrically insulating layer around said core. In one or more embodiments, the method also includes applying a magnetic field configured to align a hard axis of magnetization of the magnetic polymer in parallel with said magnetic core plane.

IN THE DRAWINGS

For a fuller understanding of the nature and advantages of the present invention, reference is be made to the following detailed description of preferred embodiments and in connection with the accompanying drawings, in which.

DETAILED DESCRIPTION

Aspects of the present invention relate to soft ferromagnetic particles embedded in a polymer matrix to create a ferromagnetic polymer composite material, hereafter referred to as a "magnetic polymer," in microelectronic fabrication and assembly. Utilizing the magnetic polymer as an insulating and/or stress-relief layer(s) in microelectronic fabrication and/or as an underfill epoxy in microelectronic assembly enables enhancement of the inductance of microelectronic devices containing magnetic components.

Figure 1:
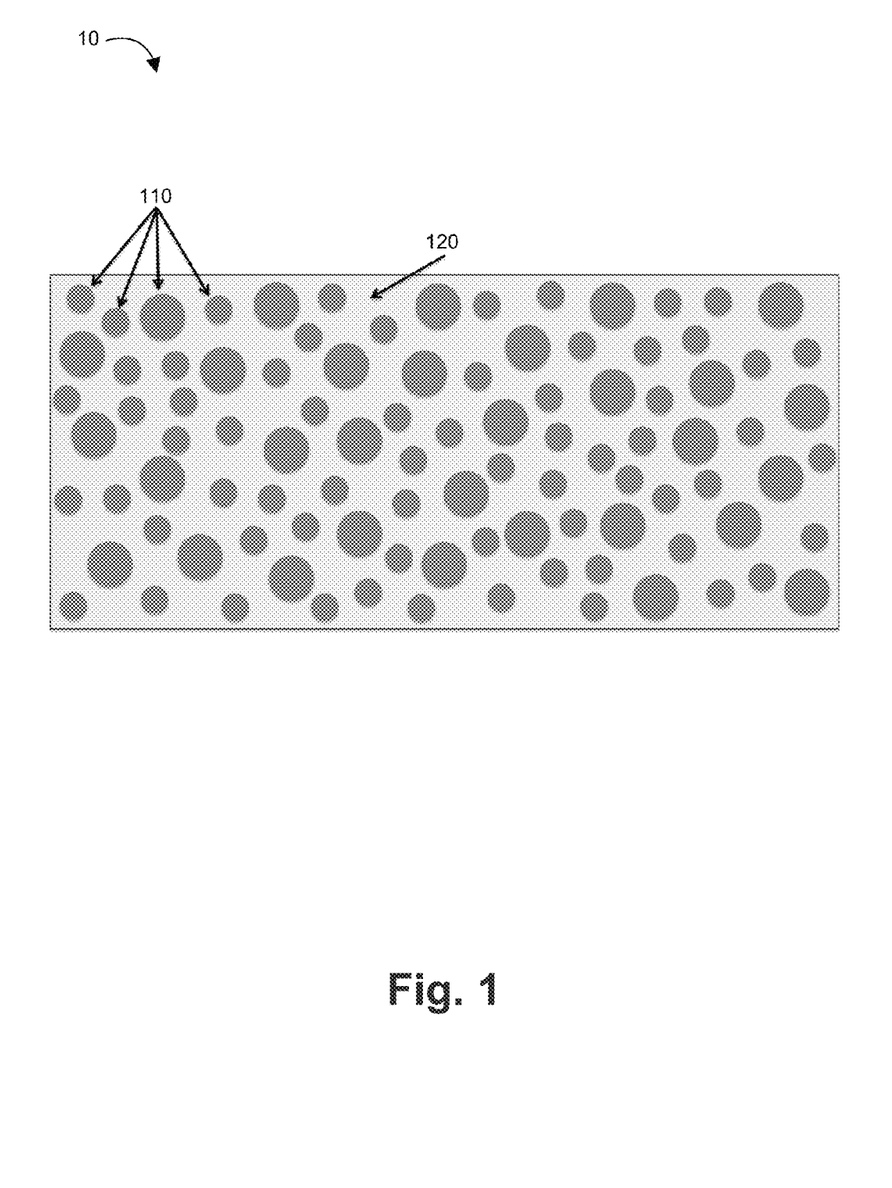
FIG. 1 illustrates a side view of a magnetic polymer layer according to an embodiment.

FIG. 1 illustrates a side view of a magnetic polymer layer 10 according to an embodiment. The magnetic polymer layer 10 includes ferromagnetic particles 110 disposed in a polymer matrix 120. The ferromagnetic particles 110 are formed of one or more soft ferromagnetic materials or alloys or oxides thereof. For example, the ferromagnetic particles 110 can include at least one of Co, Ni, Fe, and/or their respective oxides. The ferromagnetic particles 110 can have a size (e.g., length or diameter), an average size, or a median size of less than or equal to about 10 microns, for example about 2 to about 7 microns, about 3 to about 6 microns, or about 5 microns, or about 5 to about 100 nanometers. As used herein, "about" means plus or minus 10% of the relevant value.

The polymer matrix 120 can be a dielectric (e.g., liquid or spin-on deposited dielectric) such as silicon dioxide ($SiO_2$), a photoimageable polymer (e.g., a photoresist) such as a polyimide, polymethylmethacrylate or polydimethylsiloxane, or a non-photoimageable polymer such as a polyimide or epoxy.

The magnetic polymer can be manufactured by disposing ferromagnetic particles in the polymer matrix and mixing the constituent parts using any mixing method that provides an approximately homogeneous distribution of the ferromagnetic particles in the polymer matrix. The homogeneous distribution is determined by achieving a similar concentration (e.g., plus or minus 10% variation in concentration) of ferromagnetic particles per unit volume across the entire volume of the polymer matrix.

Figure 2:
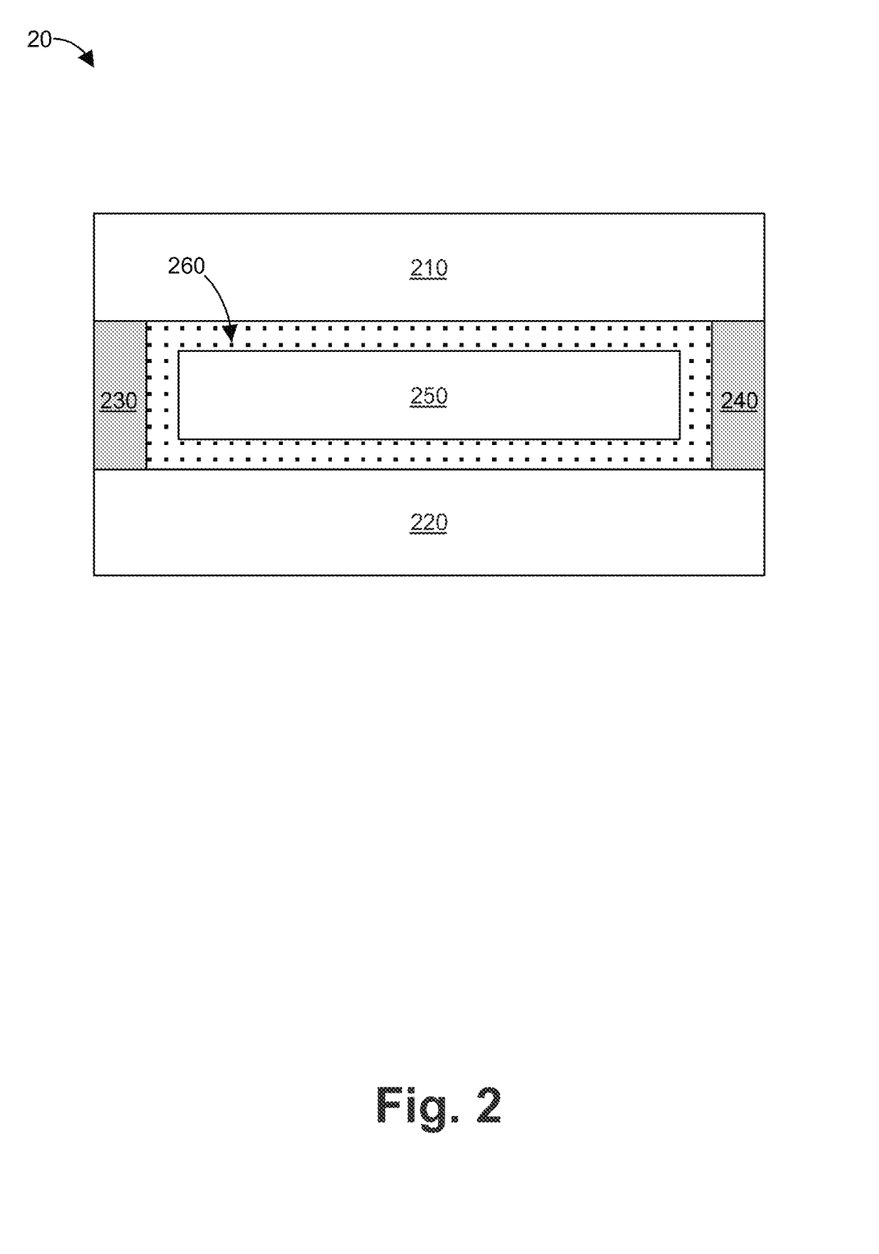
FIG. 2 illustrates a cross section of an exemplary inductor according to an embodiment.

FIG. 2 illustrates a cross section of an exemplary inductor 20 according to an embodiment. The inductor 20 can be deployed in an electrical system such as a voltage regulator, a power converter (e.g., an integrated power converter), a radio-frequency (RF) signal chain, an electrical impedance matching network, or a similar device. The inductor 20 includes first and second conductor layers 210, 220 that are electrically connected by conducting VIAs 230, 240. The conductor layers 210, 220 and VIAs 230, 240 form a conductive winding or coil around a magnetic core 250. The magnetic core 250 can include several layers of electrically insluting materials that prevent the magnetic core or inductor coil from electrically coupling in an undesirable way. These insulating materials are generally vapor deposited dielectrics such as $SiO_2$ or photoimageable polymer layers such as polyimide. In some embodiments, the core 250 includes a magnetic layer and a non-magnetic layer or a plurality of such layers in a laminate configuration of alternating magnetic and non-magnetic layers. An example of a magnetic core, including a core having a laminate configuration, can be found in U.S. patent application Ser. No. 13/609,391 and U.S. patent application Ser. No. 14/571, 649, which are incorporated herein by reference. The '391 and '649 applications are assigned to the same assignee as the present application. An additional example of a laminate configuration is described below with respect to FIG. 3.

A magnetic polymer 260 surrounds the core 250, either completely or partially, to form a passivation and insulation layer between the core 250 and one or more of the respective electrical conductors (e.g., conductor layers 210, 220 and vias 230, 240). The magnetic polymer 260 can be the same or substantially the same as magnetic polymer layer 10 described above. The weight ratio of ferromagnetic particles (e.g., ferromagnetic particles 110) to polymer or insulator (e.g., polymer matrix 120) can range from about 1:10 to the highest weight ratio of ferromagnetic particles to polymer that allows for the polymer to be successfully processed as a passivation or insulation layer (e.g. allows the polymer to have a low enough viscosity to be able to spin on the wafer or substrate completely for photolithography processing). The highest weight ratio of ferromagnetic particles to polymer is typically about 1:1 in some embodiments.

An advantage of using magnetic polymer 260 in inductor 20 is that it can provide a net increase in the effective inductance of the inductor 20 by reducing the total magnetic reluctance for magnetic flux induced by the inductor coil, which is composed of electrical conductors (conductor layers 210, 220 and vias 230, 240). As a result, the inductor 20 exhibits an inductance enhancement and conversion efficiency improvement for power converter systems where embodiments of the invention can be applied.

Further, magnetic polymer 260 can attenuate radiated electromagnetic energy from power inductor devices to reduce undesirable electromagnetic interference (EMI). This EMI benefit can also be applied to other electrical circuit applications that either generate EMI or are adversely affected by EMI, where the attenuation of EMI is desirable.

In some embodiments, the magnetic polymer 260 can be biased with a magnetic field to form an anisotropic structure, as discussed below.

Figure 3:
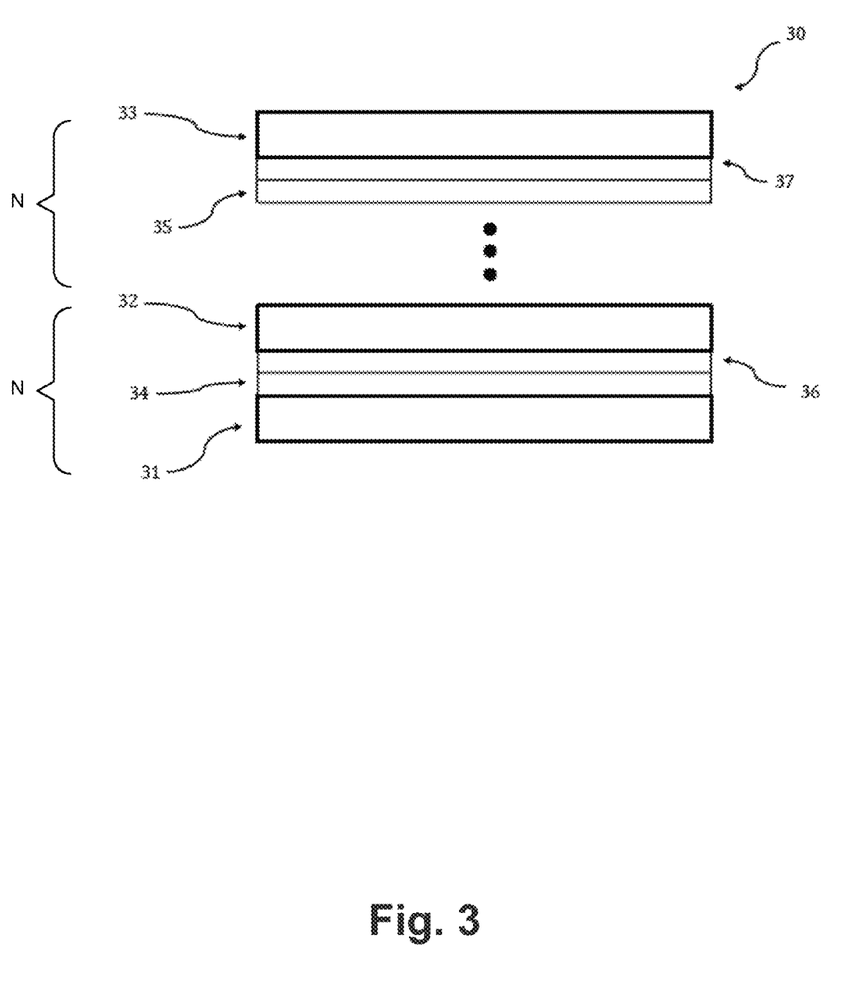
FIG. 3 illustrates an exemplary core having a laminated structure according to an embodiment.

FIG. 3 illustrates an exemplary core 30 having a laminated structure. The core stack 30 includes more than two (N) laminations of magnetic material layers 31, 32, 33. One skilled in the art can appreciate the limit to number N of stacks is a practical, engineering consideration.

Each magnetic layer 31, 32, 33 is separated by insulating layers 34, 35 and optional interface layers 36, 37. For example, soft magnetic layers 31, 32 are separated by insulating layer 34 and interface layer 36 and so forth. One or both insulating layers 34, 35 can include the magnetic polymer 10, 260 described above. The core stack 30 can also be surrounded by a magnetic polymer, for example similar to the configuration illustrated in FIG. 2. In addition or in the alternative, one or both insulating layers 34, 35 be an oxide (or other variant) of a first magnetic material used for magnetic layer 31, 32, and/or 33. Such an oxide can be formed by exposing the underlying magnetic film layer (e.g., layer 31) to an oxygen-rich environment, which can promote the growth of a thermal oxide as electrically insulating layer (e.g., layer 34). Alternatively, the electrically insulating layer 34, 35 can be formed by depositing the first magnetic material in an oxygen-rich environment so that the first magnetic material is oxidized as it is deposited to form electrical insulating layer 34, 35.

As illustrated in FIG. 3, first insulating layer 34 is disposed between first magnetic layer 31 and second magnetic layer 32. First interface layer 36 is disposed between the first magnetic layer 31 and the second magnetic layer 32. Specifically, the first interface layer 36 is disposed between the second magnetic layer 32 and the first insulating layer 34. Alternatively, the first interface layer 36 can be disposed between the first magnetic layer 31 and the first insulating layer 34.

Laminated plurality stack 30 also includes third magnetic layer 33 where the second magnetic layer 32 is disposed between the first magnetic layer 31 and the third magnetic layer 33. Second insulator 35 is disposed between the second magnetic layer 32 and the third magnetic layer 33. Second interface layer 37 is disposed between the second magnetic layer 32 and the third magnetic layer 33. Specifically, the second interface layer 37 is disposed between the third magnetic layer 33 and the second insulating layer 35. Alternatively, the second insulating layer 33 can be disposed between the third magnetic layer 33 and the second interface layer 37.

Laminated plurality stack 30 can include a fourth (or additional) magnetic layer where the third magnetic layer 33 is disposed between the second magnetic layer 32 and the fourth magnetic layer 33. An insulator layer and/or an interface layer can be included between the fourth magnetic layer and the third magnetic layer 33 in the same arrangement as the rest of the laminated plurality stack 30 described above.

Magnetic layers 31, 32 can comprise soft ferromagnetic materials. Soft ferromagnetic materials have a number of useful applications within circuits and microelectronic applications. They exhibit high permeability and low coercivity; two properties that are useful for enhancing inductance. Suitable soft magnetic materials employed in one or more embodiments comprise alloys containing at least one of Co, Ni or Fe.

The use of an oxide (or other variant) of the first magnetic material can provide benefits in manufacturing cost and throughput by reducing the total number of unique deposition process employed in device fabrication. In addition or in the alternative, the use of an oxide of the first magnetic material can provide benefits in device reliability because the material similarities between the first magnetic material (e.g., layer 31) and an oxide of the first magnetic material (e.g., layer 34) can improve adhesion there between (i.e., adhesion between electrically insulating layer 34 and magnetic film layer 31 and/or 32). Also, an oxide of the first magnetic material can reduce mechanical stress at the interfaces between electrically insulating layer 34 and magnetic film layer 31 and/or 32. If adhesion between adjacent material laminations is poor, the material stack may delaminate during device fabrication or during use in the field by the end user. If significant mechanical film stress (e.g., less than −250 MPa (compressive stress) or greater than 250 MPa (tensile stress)) is present at these interfaces, such mechanical film stress can negatively impact the magnetic properties of magnetic film layer 31 and/or 32 when the materials composing those layers exhibit non-zero magnetostriction, which is the physical phenomenon that relates film stress and magnetization in ferromagnetic materials.

Each lamination N is thin (about 1 nm to about 500 nm) and electrically isolated. The thickness of each electrically insulating layer (e.g., layer 34) can be selected to provide adequate resistance between any two adjacent magnetic laminations (e.g., layers 31 and 32) to suppress eddy currents, and also to promote dipolar coupling between adjacent magnetic laminations. The thickness of each electrically insulating layer (e.g., layer 34) can be determined by the material system of the insulating layer, the method of material synthesis, the quality of the insulating layer 34/magnetic film layer 31, 32 interface and/or the electrical properties of the insulating layer 34. For the purpose of reducing eddy current losses, the combined thickness and resistivity of the insulating layer 34 can be selected so that the skin depth for the laminated magnetic core 30 is greater than the thickness of a single magnetic lamination. Eddy currents can be a major source of loss at high frequencies.

In addition or in the alternative, the electrically insulating layer 34 can promote dipolar coupling between adjacent magnetic laminations (e.g., magnetic film layers 31 and 32). Dipolar coupling between adjacent magnetic laminations is desirable because it can provide for magnetic flux closure between the magnetic laminations. Without dipolar coupling, flux closure can occur within individual magnetic laminations, which can lead to a larger number of magnetic domains and consequently a larger number of domain walls, increasing the coercivity of the magnetic film layer. When a closed path for magnetic flux is formed between two adjacent magnetic laminations, there can be reduced occurrence of magnetic domain walls and, consequently, there can be improved magnetic coercivity for the structure.

Laminations of soft magnetic materials are integrated with other electronic circuits on a single, or multiple semiconductor substrates, in order to improve inductance, or to provide additional functionality that would not otherwise be available on an integrated circuit. Specifically, the integration of magnetic films enables efficient switched inductor power conversion. The laminated magnetic film is magnetically coupled to a coil or strip line that is composed of one or more layers of electrical conductor, in order to provide a high quality inductance with low resistance through the conductive element.

Figure 4:
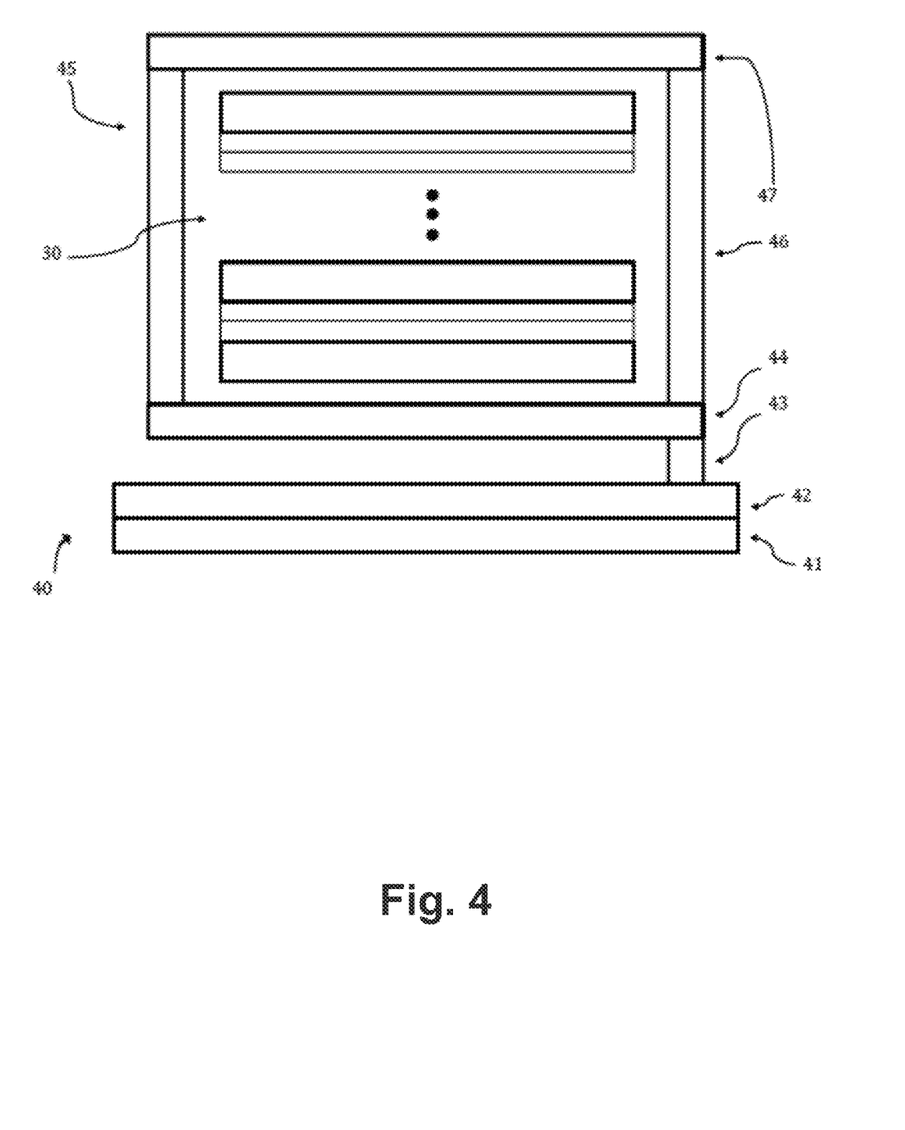
FIG. 4 is a graphical abstraction of an exemplary laminated, integrated inductor disposed on a silicon substrate according to an embodiment.

FIG. 4 is a graphical abstraction of an exemplary laminated, integrated inductor 40 disposed on a silicon substrate 41. At the heart of the integrated inductor 40 is laminated plurality stack 30. Laminated plurality stack 30 is disposed under and on top but electrically insulated from electrical conduction layers 44, 47. The conductor in the present embodiment are electrically conductive vertical interconnect accesses (VIAs) 45, 46 and are in electrical communication (e.g., in direct or indirect connection) with electrical conduction layers 44, 47, at least in part. However, electrical interconnect 44, 45, 46, 47 can be any suitable electrical conductor such as a trace, wire or VIA. Depending on application, the electrical interconnect 44, 45, 46, 47 is constructed to compose one or more coils, with magnetic core 30 at the center. In some embodiments, the electrical conduction layers 44, 47 are in electrical contact (e.g., in direct physical contact) with VIAs 45, 46.

The electrical interconnect 44, 45, 46, 47 that compose one or more inductor coils are magnetically coupled to laminated stack 30. Power is transmitted between front-end-of-line (FEOL) transistor layer 42 and the one or more inductors composed of 30, 44, 45, 46, 47 through electrical interconnect 43. Electrical interconnect layers 44, 47 and VIA layers 45, 46 are a cross-section of an electrical winding that wraps around the laminated plurality stack 30 to form an inductor as described above. FEOL is the first portion of integrated circuit (IC) fabrication where the individual devices (transistors, capacitors, resistors, etc.) are patterned in the semiconductor. FEOL generally covers everything up to (but not including) the deposition of metal interconnect layers 44, 47.

Figure 5:
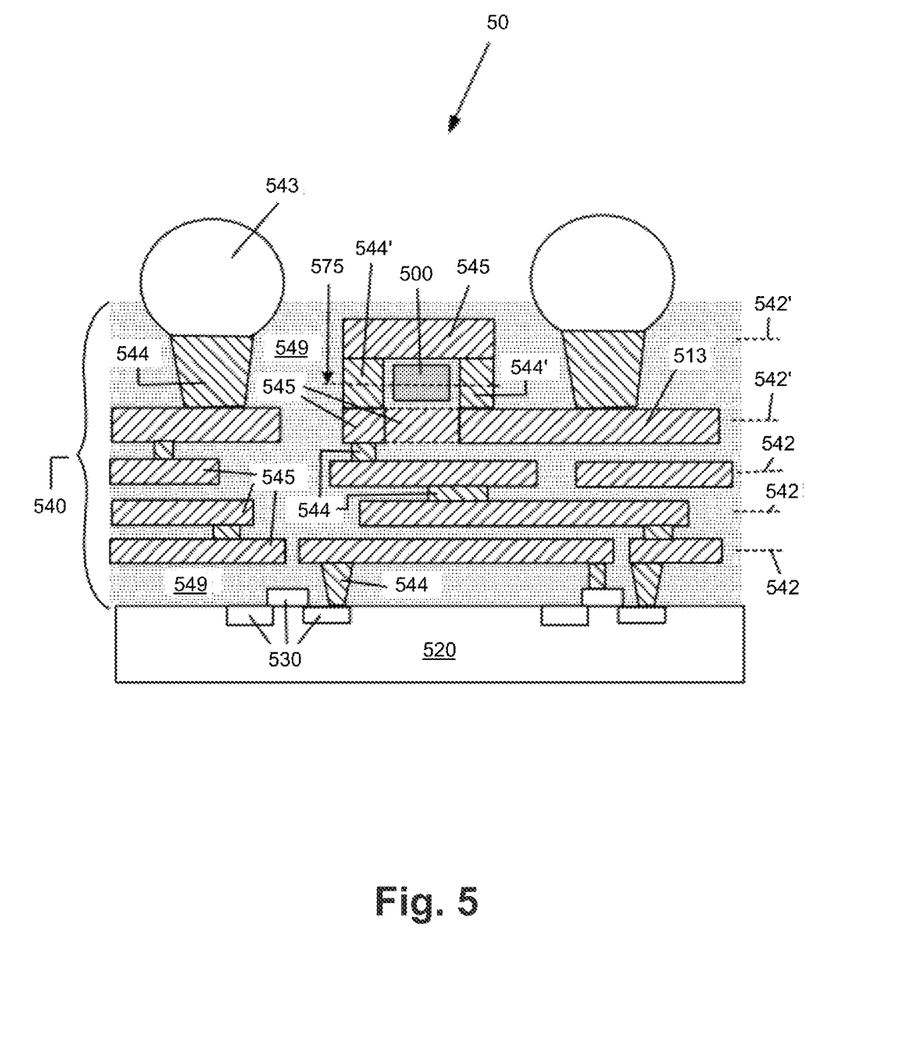
FIG. 5 is a schematic cross sectional view of an integration of an inductor into the multilevel wiring network, or BEOL, of a semiconductor IC according to an embodiment.

FIG. 5 is a schematic cross sectional view of an integration 50 of an inductor into the multilevel wiring network, or BEOL, of a semiconductor IC. The figure shows symbolically represented circuit components 530, such as CMOS devices, have been processed on a semiconductor substrate 520. The devices may be any kind, planar or three dimensional FinFET type, and the substrate, as well, any kind, bulk, SOI, Si-based, or some other semiconductor based, without limitation. Pertaining to the same die, and over the semiconductor substrate 520 and the components 530, a multilevel wiring network 540 has been fabricated.

The multilevel wiring network 540 is arranged into wiring planes 542. FIG. 5 depicts 5 wiring planes 542 but without limitation on any actual number of planes. Each wiring plane 542 contains wire segments 545. Electrical connections between wiring segments 545 of differing wiring planes 542 are provided by VIAs 544. Also shown are typical IC chip contact structures 543, usually referred to in the art as C4 contacts, solder bumps, or copper pillars, but any other contacts for the chip's external communication are acceptable without limitation. The spaces in the wiring network 540 are typically filled with a dielectric insulating material 549, of which quite a few are known in the art, such as SiO2.

The schematic depiction of FIG. 5 illustrates an inductor with a single planar magnetic core 500 integrated 50 into the multilevel wiring network 540. The principal plane 575 of the planar magnetic core 500 is substantially parallel with the wiring planes 542. The conductive winding of the inductor, forming a general spiral on the outside of the planar magnetic core 500 is piecewise constructed of wire segments 545 and of VIAs 544. The wire segments 545 forming the winding pertain to at least two of the wiring planes 542' and the VIAs 544' that form the parts of the windings that are vertical to the principal plane 500 are interconnecting the at least two wiring planes 542'. The wire segment underneath the planar magnetic core 500 is delineated with dashed lines indicating that, depending how the winding spirals are constructed, it may not be visible in the depicted cross sectional plane. A possible lead 513 to the windings is also shown.

In state of the art semiconductor ICs the multilevel wiring network 540 typically uses Cu and/or Al for wire segments and VIAs, and it is fabricated with a damascene, or dual damascene technique, as known in the art. Since the planar magnetic core 500 is manufacturable with known semiconductor processing methods, for instance, sputtering, or electroplating, its integration may be seamlessly included into the BEOL processing.

Magnetic core 500 can include a laminate configuration having alternating magnetic and non-magnetic layers. The non-magnetic layers can be or can include the magnetic polymer 10, 260 described above. In addition or in the alternative, the core 500 can be partially or completely surrounded by a magnetic polymer, for example similar to the configuration illustrated in FIG. 2.

By way of example, without intent of limiting, the magnetic layer core can include CZT, or Co(X)Zr(Y)Ta(1–X–Y), with X and Y being approximately 0.915 and 0.04, respectively. The non-magnetic layer may be composed of more than one constituent layers. Again, by way of example, these component layers may be an insulator layer, such as SiO2, CoO, or a magnetic polymer, and a metal layer, such as Ta. The purpose of the insulating layer is to prevent electrical current circulation in the planar magnetic core perpendicularly to the principal plane (i.e., eddy currents), as discussed above. The purpose of the metal layer can be to ease fabrication by smoothing the surface during deposition. The non-magnetic layer may have structures and properties beyond those of simply having constituent layers. In some embodiments of the present invention the non-magnetic layer may have current rectifying properties.

The sequential deposition of the various layers of core 500 may include some techniques known in the semiconductor processing arts, for instance, masking, sputtering, electroplating. The fabrication of the core 500 may be done in the presence of an applied magnetic field to help with the orientation of the deposited magnetic layers. The thickness of the non-magnetic layers may be in the range of about 5 nm to about 100 nm, while the magnetic layer thickness may be in the range of about 10 nm to about 1,000 nm, more typically between about 50 nm to about 500 nm. Of course, one may be able to apply other magnetic materials, such as Ni and Fe, and other layers, or means, to suppress eddy currents. Embodiments of the present invention do not limit any of these choices.

Figure 6:
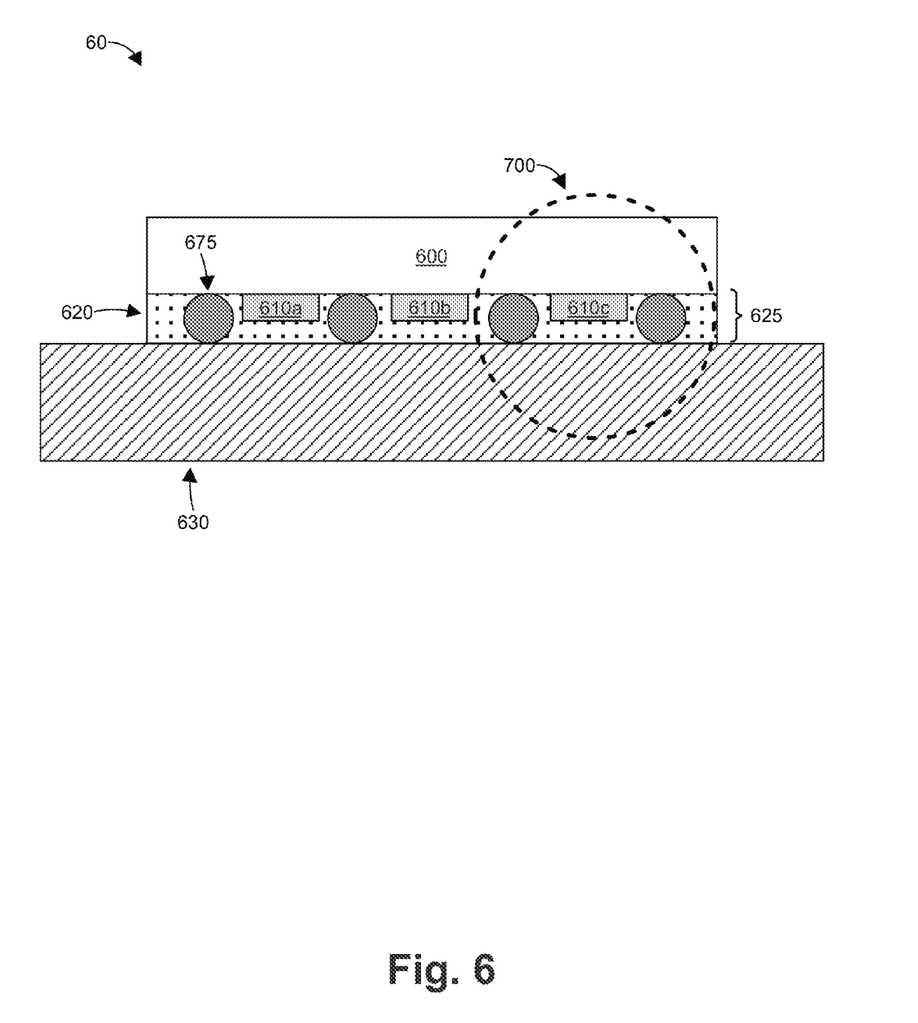
FIG. 6 illustrates a side view of a package assembly according to an embodiment.

FIG. 6 illustrates a side view of a package assembly 60 according to an embodiment. The assembly 60 includes an integrated circuit 600, inductors 610, underfill epoxy layer 620, and substrate 630. As shown in FIG. 6, the integrated circuit 600 is electrically connected to inductors 610a-c (generally inductors 610), for example through backend wiring to an integrated processor. The integrated circuit 600 and inductors 610 are disposed or packaged on substrate 630 with epoxy layer 620. In some embodiments, integrated circuit 600 can be replaced with an integrated passive device (IPD). The epoxy layer 620 may be comprised of a magnetic polymer material, as discussed above. Contacts 675, such as C4 contacts or the like, are disposed between integrated circuit 600 and substrate 630 to provide an electrical path therebetween.

The magnetic epoxy can be manufactured by disposing ferromagnetic particles in the epoxy matrix and mixing the constituent parts using any mixing method that provides an approximately homogeneous distribution of the ferromagnetic particles in the epoxy matrix. The ferromagnetic particles can have a size (e.g., length or diameter), an average size, or a median size of less than or equal to about 10 microns, for example about 2 to about 7 microns, about 3 to about 6 microns, or about 5 microns, or about 5 to about 100 nanometers.

The homogeneous distribution is determined by achieving a similar concentration (e.g., plus or minus 10% variation in concentration) of ferromagnetic particles per unit volume across the entire volume of the epoxy matrix. The weight ratio of ferromagnetic particles to epoxy can range from about 1:10 to the highest weight ratio of ferromagnetic particles to polymer that allows for the polymer to be successfully processed as an underfill (e.g. allows the epoxy to have a low enough viscosity to be able to flow between the parts completely to fill any voids between the parts and provide sufficient adhesion once the magnetic epoxy is cured). The highest weight ratio of ferromagnetic particles to epoxy is typically about 1:1 in some embodiments. The electrical, thermal and mechanical properties of the resultant magnetic polymer can be similar to conventional underfill epoxies, such as having a high electrical resistivity, a low thermal resistivity, and/or a high rigidity following the epoxy curing process.

Figure 7:
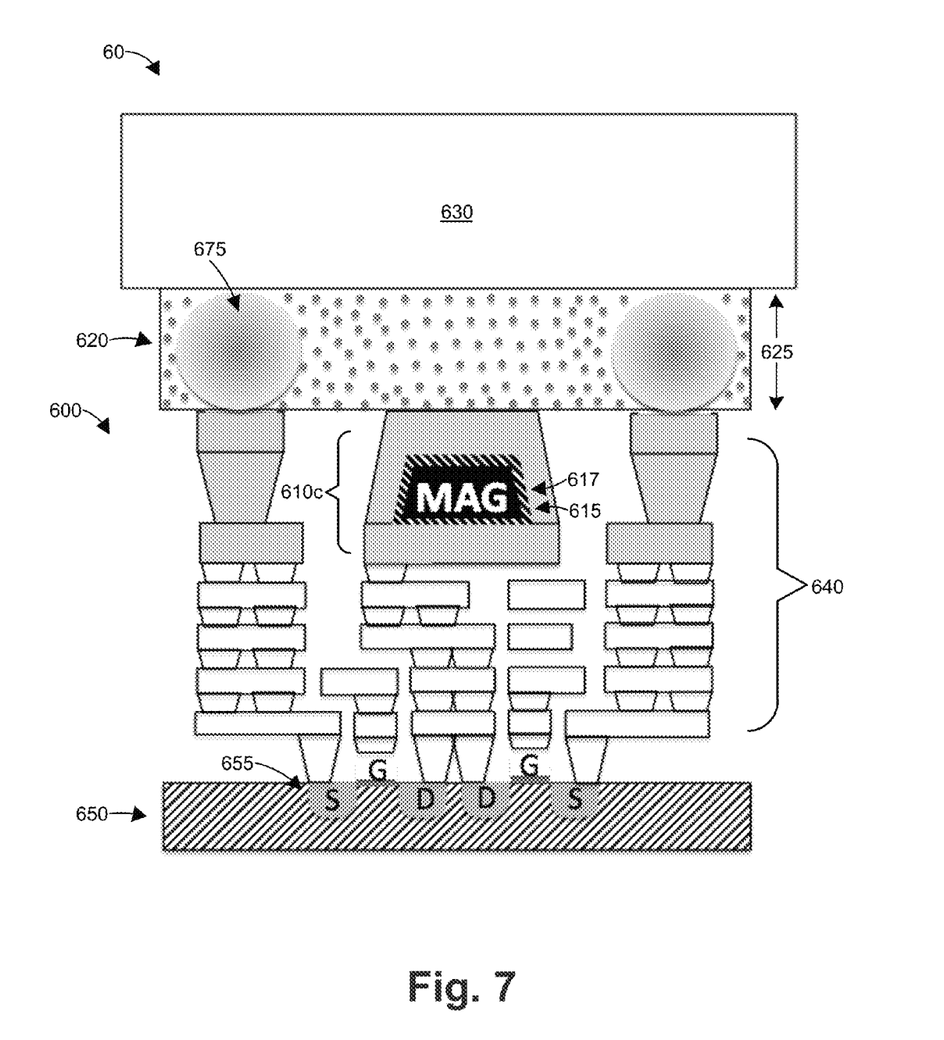
FIG. 7 illustrates an exploded view of the package assembly from FIG. 6.

FIG. 7 illustrates an exploded view of package assembly 60 from FIG. 6. In particular, FIG. 7 illustrates an exploded, upside down view of area 700 from FIG. 6 (indicated by a dashed line). As illustrated in FIG. 7, the integrated circuit 600 includes a substrate 650 (e.g., silicon) into which active regions 655 (e.g., source and drain) have been defined. The active regions 655 are connected through backend wiring 640 to contacts 675, which connect the wiring 640 to the package substrate 630.

Inductor 610c is integrated into backend wiring 640, similar to the manner discussed above. Inductor 610c includes a core 615, which can include one or more soft ferromagnetic materials. The core 615 can include multiple layers/laminations, including magnetic and non-magnetic layers, as discussed above. The non-magnetic layer can include a magnetic polymer. In addition, the core 615 can optionally be partially or completely surrounded by magnetic polymer material 617 (indicated by hashing in FIG. 7).

The integrated circuit 600 and contacts 675 are mounted on package substrate 630 with epoxy layer 620, which includes a magnetic epoxy material, as discussed above. To mount the processor 600 and contacts 675 on package substrate 630, the epoxy layer 620 flows onto the surface of package substrate 630 and surrounds contacts 675. Since the size, the average size, or the median size of the ferromagnetic particles in the magnetic epoxy material are less than or equal to about 10 microns, the magnetic polymer material can flow under contacts 675, which generally are about 30 to about 100 microns in size. After the epoxy layer 620 is in place, it is cured through heat, light, or other means to form a solid material. Depending on the epoxy material used, the curing process can include heating the epoxy from any temperature between about 20° C. and about 150° C. for between about 3 hours to about 24 hours in a heating apparatus such as a hotplate, oven or furnace. A magnetic field can be applied to epoxy layer 620 during or after curing to induce magnetic anisotropy in epoxy layer 620. The magnetic field is applied so that it passes through epoxy layer 620 parallel to its height 625. In response to the magnetic field, the easy axis of magnetization aligns with the magnetic field (i.e., parallel to height 625), which causes the hard axis of magnetization to align orthogonally to height 625. As such, the hard axis of magnetization is parallel or substantially parallel to the plane defined by package substrate 630 and/or the plane defined by processor 600 (e.g., the plane defined by the die on which the processor 600 is fabricated). Such alignment techniques are described in further detail in U.S. patent application Ser. No. 14/746,994, entitled "Apparatus and Methods for Magnetic core Inductors with Biased Permeability," which is incorporated herein by reference. The '994 application is assigned to the same assignee as this application.

Figure 8:
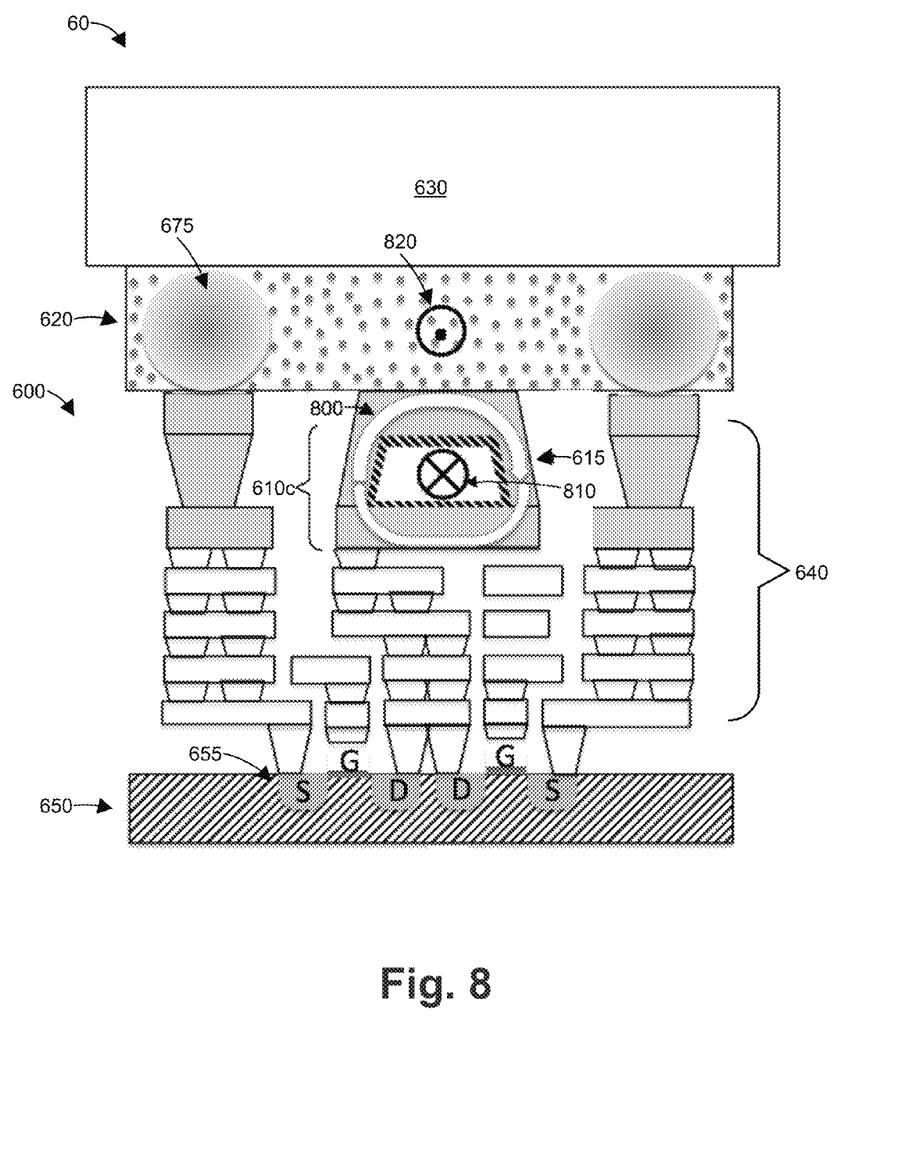
FIG. 8 illustrates a second exploded view of the package assembly from FIG. 6 to illustrate the current flow and resulting magnetic flux.

FIG. 8 illustrates a second exploded view of package assembly 60 to illustrate the electrical current flow and resulting magnetic flux. Specifically, electrical current 800 flows in the coil around core 615 in a clockwise direction. The current 800 induces a magnetic field in a plane orthogonal to current 800 (into the plane of the page). The plane is parallel to the plane defined by the magnetic field flow into 810 core 615 (i.e., into the page) and out of 820 epoxy layer 620 (i.e., out of the page).

An integrated power inductor that resides on either an integrated circuit IC substrate or integrated passive device substrate (e.g., substrate 650) may have inductors that induce magnetic flux predominately parallel to the IC or IPD substrate (solenoid or toroid inductor) or predominately orthogonally to the IC or IPD substrate (planar spiral inductor). For power conversion applications it is typically preferable to have the magnetic flux oriented parallel to the substrate plane in order to reduce losses associated with magnetic flux coupling, particularly in the presence of a conductive substrate. The application of a magnetic underfill epoxy for an IC or IPD substrate with power inductors radiating magnetic flux parallel to the substrate plane can provide a substantial inductance enhancement and will reduce inductor EMI relative to a similar instance where a non-magnetic underfill epoxy is used.

Likewise, application of a magnetic underfill epoxy for an IC or IPD substrate with power inductors radiating magnetic flux orthogonal to the substrate plane can provide a substantial inductance enhancement and can reduce inductor EMI relative to a similar instance where a non-magnetic underfill epoxy is used. In FIG. 8, current 800 flowing through the coil around core 615 induces a magnetic flux into 810 the plane of the page in the region of the magnetic core 615 and a magnetic flux out of 820 the plane of the page in the region of the magnetic underfill epoxy 620. The ferromagnetic particles in the epoxy can provide an increased volume of magnetic material in close proximity to the magnetic core which directly correlates to an increased inductance of the inductor device 610c. The ferromagnetic particles in the epoxy 620 can also reduce EMI from the inductor device 610c by shielding the magnetic flux 820 to within the magnetic underfill epoxy layer 620 and not allowing the magnetic flux to approach the package substrate 630 to the same degree as a similar instance where a non-magnetic underfill epoxy is used.

Figure 9:
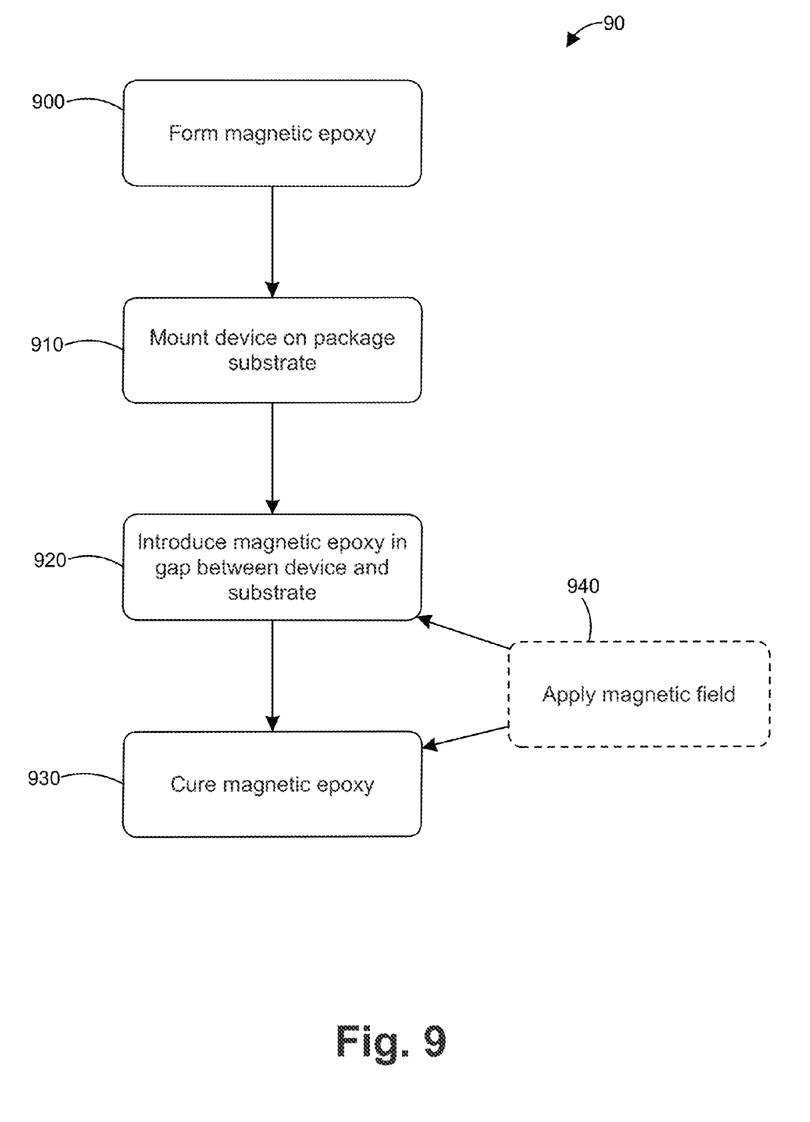
FIG. 9 is a flow chart that illustrates a method of manufacturing a packaged integrated device according to an embodiment.

FIG. 9 is a flow chart that illustrates a method 90 of manufacturing a packaged integrated device according to an embodiment. The method 90 includes forming a magnetic epoxy 900. The magnetic epoxy is formed 900 by embedding a plurality of ferromagnetic particles in an epoxy matrix. The particles can have a size, an average size, or a median size of less than or equal to about 10 microns or any range between about 1 nanometer and about 10 microns, as discussed above. The ferromagnetic particles can be embedded into the epoxy matrix before or after the epoxy matrix is synthesized and the embedding process can be any process in which the ferromagnetic particles are homogeneously mixed within the epoxy matrix providing a similar concentration (e.g., plus or minus 10% variation in concentration) of ferromagnetic particles per unit volume of the epoxy matrix across the entire volume of the epoxy matrix. The epoxy matrix is synthesized and manufactured according to the standard process of that epoxy provided by the epoxy vendor. Any epoxy suitable for electronic packaging applications can be used with a low viscosity epoxy (e.g., less than about 5000 cPs at 100 RPM and 23° C.) being preferable. In some embodiments, the magnetic epoxy can be manufactured by a third party supplier.

In step 910, the integrated device is mounted on a package substrate, for example as discussed above with respect to FIGS. 6-8. The integrated device can be an integrated circuit or an IPD having multiple backend wiring layers in which an inductor is formed in one or more of such wiring layers. The mounting includes disposing the package substrate on contacts to the last backend wiring layer of the integrated device. Alternatively the mounting includes disposing the contacts on the package substrate. In either case, a gap forms between the last backend wiring layer and the substrate in the space between adjacent contacts.

In step 920, the magnetic epoxy is introduced into the gap. The magnetic epoxy flows through the gap to surround the contacts and to contact the package substrate and the last backend wiring layer. The magnetic epoxy has a sufficient viscosity to permit such flow. Any epoxy suitable for electronic packaging applications can be used with a low viscosity epoxy (e.g., less than about 5000 cPs at 100 RPM and 23° C.) being preferable.

In step 930, the magnetic epoxy is cured through exposure to heat, light or a combination of heat and light, as discussed above. The curing causes the viscous magnetic epoxy material to crosslink, which results in a solid material that adheres to the contacts, package substrate, and last backend wiring layer.

In optional step 940, a magnetic field is applied during step 920 to induce the magnetic epoxy to flow into the gap. The magnetic field can be generated by a permanent magnet or as an electrically induced DC magnetic field. The magnetic field strength is that necessary to cause physical movement of the magnetic epoxy to flow into the gap, which is dependent on the type of magnetic field and location of the magnetic field with respect to the magnetic epoxy. In addition or in the alternative, a magnetic field is applied during or after step 930 to induce anisotropy (i.e., setting the easy and/or hard axes of magnetization) into the epoxy. The magnetic field can be generated by a permanent magnet or generated as an electrically induced DC magnetic field. The magnetic field is aligned to induce anisotropy of the magnetic epoxy with a hard axis parallel to the hard axis of the planar magnetic core in the inductor device.

Figure 10:
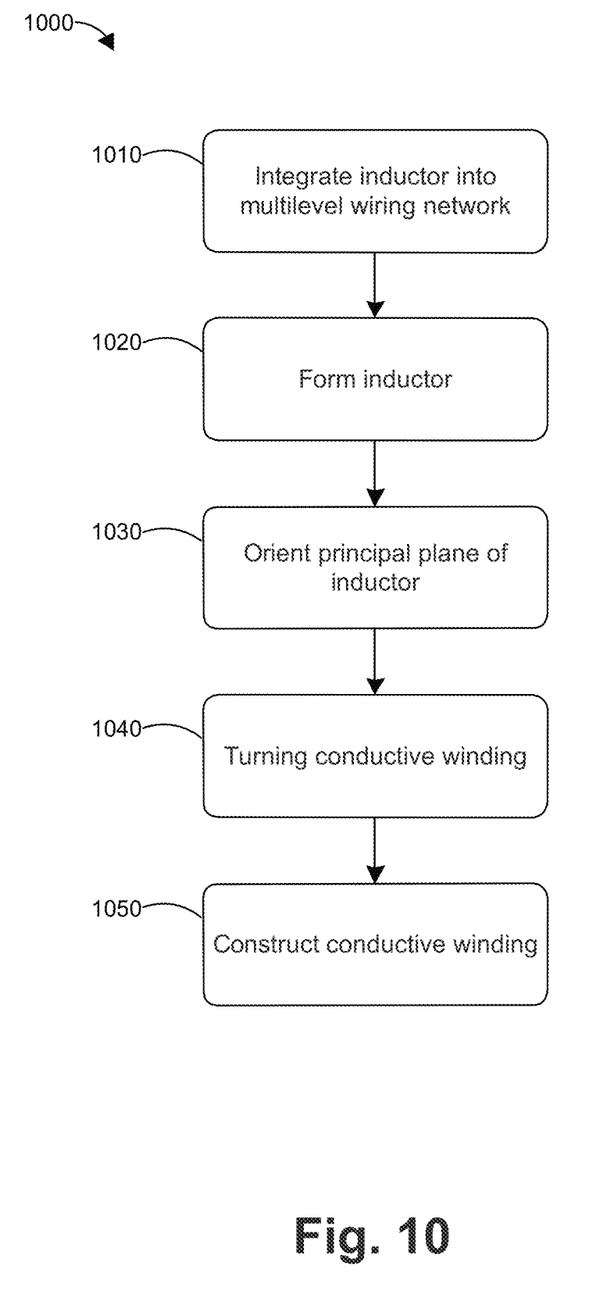
FIG. 10 is a flow chart that illustrates a method of manufacturing an integrated device according to an embodiment.

FIG. 10 is a flow chart that illustrates a method 1000 of manufacturing an integrated device according to an embodiment. The method 1000 includes step 1010 in which an inductor is integrated into a multilevel wiring network of the integrated device. The integrated device can be an integrated circuit, an integrated passive device, or similar device. At least a portion (e.g., the conductive winding) is integrated into the multilevel wiring network.

In step 1020, the inductor is formed from a planar magnetic core and a conductive winding, as discussed above.

In step 1030, a principal plane of the magnetic core is oriented in parallel with a plane defined by each wiring plane.

In step 1040, the conductive winding is turned or wrapped around the magnetic core in a generally spiral manner.

In step 1050, the conductive winding is constructed piecewise of wire segments and of vertical interconnect accesses (VIAs). The wire segments pertain to at least two wiring planes and the VIAs interconnect at least two wiring planes. The VIAs and wiring planes are formed in part by patterning and etching a photoresist comprising a magnetic polymer.

Therefore it can be seen that the present invention can enhance the inductance values in integrated structures that include an inductor, such as switched power converter inductor. The magnetic polymer can be used as an insulation layer around a magnetic core of an inductor and/or as part of a laminate structure of the core. The magnetic polymer can be in the form of a photoresist for patterning into the desired insulation layer. In addition or in the alternative, the magnetic polymer can be in the form of a magnetic epoxy to mount an integrated semiconductor die or an integrated passive device to a package substrate. The magnetic epoxy can enhance the inductance value of an inductor incorporated into the integrated semiconductor die or the integrated passive device.

The embodiments described and illustrated herein are not meant by way of limitation, and are rather exemplary of the kinds of features and techniques that those skilled in the art might benefit from in implementing a wide variety of useful products and processes. For example, in addition to the applications described in the embodiments above, those skilled in the art would appreciate that the present disclosure can be applied to other applications.

The present invention should not be considered limited to the particular embodiments described above, but rather should be understood to cover all aspects of the invention as fairly set out herein. Various modifications, equivalent processes, as well as numerous structures to which the present invention may be applicable, will be readily apparent to those skilled in the art to which the present invention is directed upon review of the present disclosure.

What is claimed is:

1. A method of fabricating a structure, the method comprising:
   disposing a plurality of ferromagnetic particles in an epoxy matrix to form a magnetic epoxy;
   mounting a package substrate on a plurality of contacts of a semiconductor integrated circuit or an integrated passive device, wherein the contacts define a gap between the substrate and the semiconductor integrated circuit or the integrated passive device, the semiconductor integrated circuit or the integrated passive device comprising a multilevel wiring network and an inductor, the inductor integrated into at least one level of the multilevel wiring network;

flowing the magnetic epoxy into the gap, the magnetic epoxy surrounding the contacts; and curing the magnetic epoxy to adhere the substrate to the semiconductor integrated circuit or the integrated passive device.

2. The method of claim 1, further comprising applying a magnetic field while flowing the magnetic epoxy, the magnetic field drawing the magnetic epoxy into the gap.

3. The method of claim 1, further comprising applying a magnetic field while curing the magnetic epoxy, the magnetic field configured to align an easy axis of magnetization of the magnetic epoxy with an axis parallel to a height of the magnetic epoxy, thereby aligning a hard axis of magnetization of the magnetic epoxy with a plane parallel to the package substrate.

4. The method of claim 1, wherein said inductor includes a core formed by depositing a magnetic material and depositing a photoresist on said magnetic material to form a laminate structure.

5. The method of claim 4, wherein said photoresist comprises a magnetic polymer.

6. The method of claim 1, wherein said inductor includes a core formed by (a) depositing a magnetic material to form a first layer and (b) depositing said magnetic material on said first layer in an oxygen-rich environment to form an insulating layer on said first layer of said magnetic material, said insulating layer comprising an oxide of said magnetic material.

7. The method of claim 1, wherein said inductor includes a core formed by (a) depositing a magnetic material to form a first layer and (b) exposing said first layer to an oxygen-rich environment to form a thermal oxide on said first layer.

8. The method of claim 1, wherein said inductor includes a core formed by (a) depositing a magnetic material to form a first layer and (b) depositing a magnetic polymer on said first layer.

9. The method of claim 1, further comprising:

forming said inductor from a planar magnetic core and a conductive winding, wherein said planar magnetic core has a principal plane; and orienting said principal plane in parallel with wiring planes of said multilevel wiring network.

10. The method of claim 9, further comprising:

turning said conductive winding around in a generally spiral manner on the outside of said planar magnetic core; and constructing said conductive winding piecewise of wire segments and of vertical interconnect accesses (VIAs), wherein said wire segments pertain to at least two of said wiring planes and said VIAs are interconnecting said at least two wiring planes.

11. The method of claim 10, further comprising disposing a magnetic polymer around said core, wherein the magnetic polymer forms an electrically insulating layer around said core.

12. The method of claim 11, further comprising applying a magnetic field configured to align a hard axis of magnetization of the magnetic polymer in parallel with said magnetic core plane.

* * * * *